United States Patent
Miyoshi et al.

(10) Patent No.: US 9,024,325 B2
(45) Date of Patent: May 5, 2015

(54) EPITAXIAL SUBSTRATE FOR SEMICONDUCTOR ELEMENT, SEMICONDUCTOR ELEMENT, PN JUNCTION DIODE, AND METHOD FOR MANUFACTURING AN EPITAXIAL SUBSTRATE FOR SEMICONDUCTOR ELEMENT

(71) Applicant: NGK Insulators, Ltd., Nagoya (JP)

(72) Inventors: Makoto Miyoshi, Inazawa (JP); Tomohiko Sugiyama, Nagoya (JP); Mikiya Ichimura, Ichinomiya (JP); Mitsuhiro Tanaka, Tsukuba (JP)

(73) Assignee: NGK Insulators, Ltd., Nagoya (JP)

( * ) Notice: Subject to any disclaimer, the term of this patent is extended or adjusted under 35 U.S.C. 154(b) by 6 days.

(21) Appl. No.: 13/746,879

(22) Filed: Jan. 22, 2013

(65) Prior Publication Data
US 2013/0134439 A1    May 30, 2013

Related U.S. Application Data

(63) Continuation of application No. PCT/JP2011/066948, filed on Jul. 26, 2011.

(30) Foreign Application Priority Data

Jul. 29, 2010    (JP) ................. 2010-170320

(51) Int. Cl.
*H01L 29/15*    (2006.01)
*H01L 21/20*    (2006.01)
(Continued)

(52) U.S. Cl.
CPC ........... *H01L 29/778* (2013.01); *H01L 21/0237* (2013.01); *H01L 21/02378* (2013.01);
(Continued)

(58) Field of Classification Search
CPC ................ H01L 21/02458; H01L 29/2003; H01L 21/0262
USPC ....................... 257/76, 194; 438/478
See application file for complete search history.

(56) References Cited

U.S. PATENT DOCUMENTS 7,915,643 B2 *   3/2011   Suh et al. ........... 257/194
8,729,595 B2 *   5/2014   Jang et al. ........... 257/99
(Continued)

FOREIGN PATENT DOCUMENTS

JP    06-283825    10/1994
JP    2005-268493 A    9/2005
(Continued)

OTHER PUBLICATIONS

Edward Kohn, et al., "*InAlN—A New Barrier Material for GaN-Based HEMTs*," International Workshop on Physics of Semiconductor Devices, 2007, IWPSD 2007, Dec. 16, 2007, 311-316.
(Continued)

*Primary Examiner* — Fernando L Toledo
*Assistant Examiner* — Neil Prasad
(74) *Attorney, Agent, or Firm* — Burr & Brown, PLLC

(57) ABSTRACT

Provided is an epitaxial substrate for use in a semiconductor element, having excellent characteristics and capable of suitably suppressing diffusion of elements from a cap layer. An epitaxial substrate for use in a semiconductor element, in which a group of group-III nitride layers are laminated on a base substrate such that a (0001) crystal plane of the group of group-III nitride layers is substantially in parallel with a substrate surface of the base substrate, includes: a channel layer made of a first group-III nitride having a composition of $In_{x1}Al_{y1}Ga_{z1}N$ ($x1+y1+z1=1$, $z1>0$); a barrier layer made of a second group-III nitride having a composition of $In_{x2}Al_{y2}N$ ($x2+y2=1$, $x2>0$, $y2>0$); an anti-diffusion layer made of AlN and having a thickness of 3 nm or more; and a cap layer made of a third group-III nitride having a composition of $In_{x3}Al_{y3}Ga_{z3}N$ ($x3+y3+z3=1$, $z3>0$).

18 Claims, 3 Drawing Sheets

(51) Int. Cl.
*H01L 29/778* (2006.01)
*H01L 29/20* (2006.01)
*H01L 29/66* (2006.01)
*H01L 29/861* (2006.01)
*C30B 23/02* (2006.01)
*C30B 25/18* (2006.01)
*C30B 29/40* (2006.01)
*H01L 21/02* (2006.01)

(52) U.S. Cl.
CPC ..... *H01L21/02458* (2013.01); *H01L 21/02505* (2013.01); *H01L 21/0254* (2013.01); *H01L 21/02579* (2013.01); *H01L 21/0262* (2013.01); *H01L 29/2003* (2013.01); *H01L 29/66204* (2013.01); *H01L 29/66462* (2013.01); *H01L 29/7786* (2013.01); *H01L 29/861* (2013.01); *H01L 21/02104* (2013.01); *C30B 23/025* (2013.01); *C30B 25/183* (2013.01); *C30B 29/403* (2013.01)

(56) References Cited

U.S. PATENT DOCUMENTS

2007/0164315 A1 7/2007 Smith et al.
2009/0072272 A1* 3/2009 Suh et al. .................. 257/194

FOREIGN PATENT DOCUMENTS

| JP | 2008-140813 A | 6/2008 |
|---|---|---|
| JP | 2008-235613 A1 | 10/2008 |
| JP | 2009-054623 A1 | 3/2009 |
| JP | 2009-231396 A1 | 10/2009 |
| JP | 2009-302191 A1 | 12/2009 |

OTHER PUBLICATIONS

Toshihide Kikkawa, "*Highly Reliable 250 W High Electron Mobility Transistor Power Amplifier*," Japanese Journal of Applied Physics, vol. 44, No. 7A, 2005, pp. 4896-4901.

Stacia Keller, et al., "*Gallium Nitride Based High Power Heterojunction Field Effect Transistors: Process Development and Present Status at UCSB*," IEEE Transactions on Electron Devices, vol. 48, No. 3, Mar. 2001, pp. 552-559.

F. Medjdoub, et al., "*Can InAlN/GaN be an Alternative to High Power / High Temperature AlGaN/GaN devices?*," IEEE IEDM Tech. Digest, 2006, pp. 673-676.

International Search Report dated Aug. 30, 2011.

Extended European Search Report (Application No. 11812472.6) dated Aug. 28, 2014.

Japanese Office Action, Japanese Application No. 2012-526510, dated Dec. 2, 2014 (4 pages).

* cited by examiner

F I G . 2
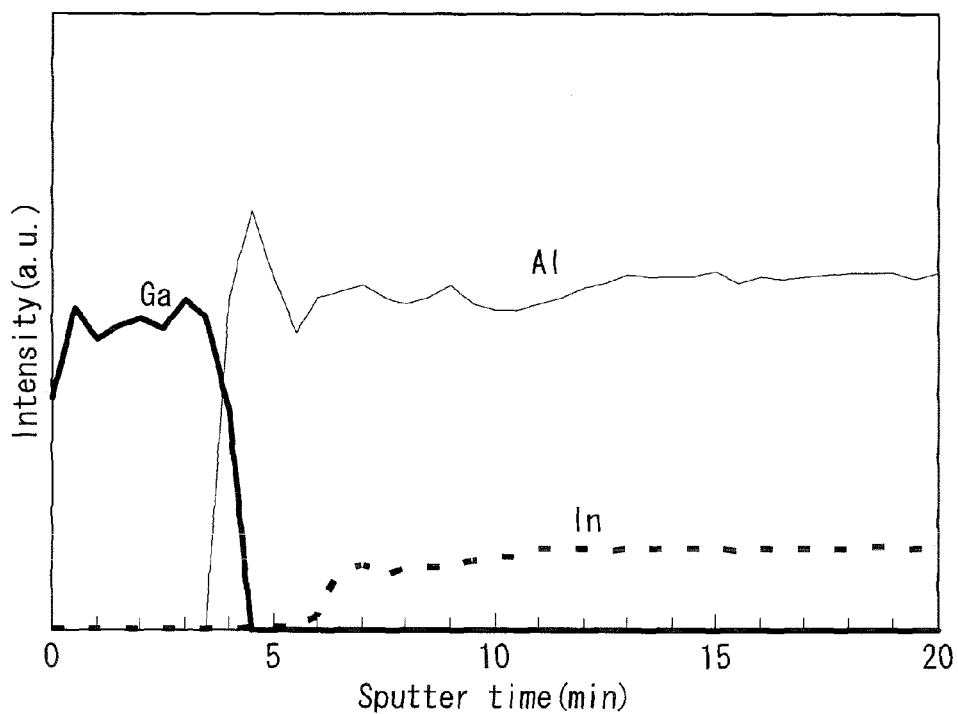
F I G . 3
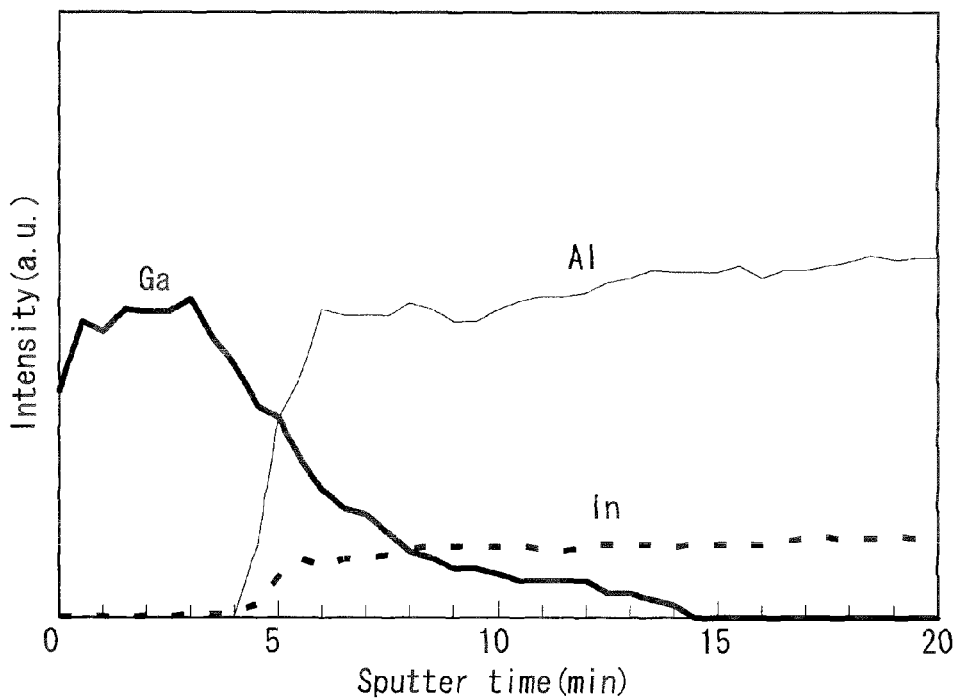

EPITAXIAL SUBSTRATE FOR SEMICONDUCTOR ELEMENT, SEMICONDUCTOR ELEMENT, PN JUNCTION DIODE, AND METHOD FOR MANUFACTURING AN EPITAXIAL SUBSTRATE FOR SEMICONDUCTOR ELEMENT

BACKGROUND OF THE INVENTION

1. Technical Field of the Invention

The present invention relates to an epitaxial substrate for a semiconductor element, and particularly to an epitaxial substrate having a multilayer structure made of a group-III nitride semiconductor.

2. Description of Related Art

A nitride semiconductor is attracting attention as a semiconductor material for a next-generation high-frequency/high-power device, because the nitride semiconductor has a high breakdown electric field and a high saturation electron velocity. For example, an HEMT (high electron mobility transistor) device in which a barrier layer made of AlGaN and a channel layer made of GaN are laminated takes advantage of the feature that causes a high-concentration two-dimensional electron gas (2 DEG) to occur in a lamination interface (hetero interface) due to the large polarization effect (a spontaneous polarization effect and a piezo polarization effect) specific to a nitride material (for example, see Non-Patent Document 1).

In some cases, a single crystal (a different kind single crystal) having a composition different from that of a group-III nitride, such as silicon and SiC, is used as a base substrate of an HEMT-device substrate. In this case, a buffer layer such as a strained-superlattice layer or a low-temperature growth buffer layer is generally formed as an initially-grown layer on the base substrate. Accordingly, a configuration in which a barrier layer, a channel layer, and a buffer layer are epitaxially formed on a base substrate is the most basic configuration of the HEMT-device substrate including a base substrate made of a different kind single crystal. Additionally, a spacer layer having a thickness of about 1 nm may be sometimes provided between the barrier layer and the channel layer, for the purpose of facilitating a spatial confinement of the two-dimensional electron gas. The spacer layer is made of, for example, AlN. Moreover, a cap layer made of, for example, an n-type GaN layer or a superlattice layer may be sometimes formed on the barrier layer, for the purpose of controlling the energy level at the most superficial surface of the HEMT-device substrate and improving contact characteristics of contact with an electrode.

It is known that, in a case where a nitride HEMT device has the most general configuration in which a channel layer is made of GaN and a barrier layer is made of AlGaN, the concentration of a two-dimensional electron gas existing in an HEMT-device substrate increases as the AlN mole fraction in AlGaN of the barrier layer increases (for example, see Non-Patent Document 2). If the concentration of the two-dimensional electron gas can be considerably increased, the controllable current density of the HEMT device, that is, the power density that can be handled, would be considerably improved.

Also attracting attention is an HEMT device having a structure with reduced strain, such as an HEMT device in which a channel layer is made of GaN and a barrier layer is made of InAlN, in which the dependence on a piezo polarization effect is small and only a spontaneous polarization is used to generate a two-dimensional electron gas with a high concentration (for example, see Non-Patent Document 3).

In a case of forming an HEMT device having the InAlN/GaN structure in which a channel layer is made of GaN and a barrier layer is made of InAlN, a cap layer including InAlGaN that contains at least Ga, such as GaN or AlGaN, is sometimes formed on the barrier layer, for the purpose of current collapse suppression. In this case, depending on conditions under which the cap layer is formed, a Ga element may diffuse within an InAlN layer that is the barrier layer, which consequently causes an electron state of an epitaxial film to vary so that device characteristics are deteriorated.

Also, in a case of forming an HEMT device having the InAlN/GaN structure, a nitride cap layer containing Mg is sometimes formed on the barrier layer, for the purpose of establishing a PN junction with an InAlN layer, as a gate electrode structure, instead of a Schottky junction. In this case, depending on conditions under which the cap layer is formed, the Mg element doped as an acceptor diffuses within the InAlN layer that is the barrier layer, so that the PN junction cannot successfully obtained.

PRIOR-ART DOCUMENTS

Non-Patent Documents

Non-Patent Document 1: "Highly Reliable 250 W High Electron Mobility Transistor Power Amplifier", TOSHIHIDE KIKKAWA, Jpn. J. Appl. Phys. 44, (2005), 4896

Non-Patent Document 2: "Gallium Nitride Based High Power Heterojuncion Field Effect Transistors: process Development and Present Status at USCB", Stacia Keller, Yi-Feng Wu, Giacinta Parish, Naiqian Ziang, Jane J. Xu, Bernd P. Keller, Steven P. DenBaars, and Umesh K. Mishra, IEEE Trans. Electron Devices 48, (2001), 552

Non-Patent Document 3: "Can/InAlN/GaN be an alternative to high power/high temperature AlGaN/GaN devices?", F. Medjdoub, J.-F. Carlin, M. Gonschorek, E. Feltin, M. A. Py, D. Ducatteau, C. Gaquiere, N. Grandjean, and E. Kohn, IEEE IEDM Tech. Digest in IEEE IEDM 2006, 673

SUMMARY OF THE INVENTION

The present invention has been made in view of the problems described above, and an object of the present invention is to provide an epitaxial substrate for a semiconductor element with excellent characteristics, capable of suitably suppressing diffusion of elements from a cap layer.

To solve the problems described above, in a first aspect of the present invention, an epitaxial substrate for use in a semiconductor element, in which a group of group-III nitride layers are laminated on a base substrate such that a (0001) crystal plane of the group of group-III nitride layers is substantially in parallel with a substrate surface of the base substrate, is provided. The epitaxial substrate includes: a channel layer made of a first group-III nitride having a composition of $In_{x1}Al_{y1}Ga_{z1}N$ (x1+y1+z1=1, z1>0); a barrier layer made of a second group-III nitride having a composition of $In_{x2}Al_{y2}N$ (x2+y2=1, x2>0, y2>0); an anti-diffusion layer made of MN and having a thickness of 3 nm or more; and a cap layer made of a third group-III nitride having a composition of $In_{x3}Al_{y3}Ga_{z3}N$ (x3+y3+z3=1, z3>0).

In a second aspect of the present invention, in the epitaxial substrate according to the first aspect, a band gap of the second group-III nitride is larger than a band gap of the first group-III nitride.

In a third aspect of the present invention, in the epitaxial substrate according to the first aspect, the second group-III nitride is $In_{x2}Al_{y2}N$ (x2+y2=1, 0.14≤x2≤0.24); and the third group-III nitride is $Al_{y3}Ga_{z3}N$ (y3+z3=1, z3>0).

In a fourth aspect of the present invention, in the epitaxial substrate according to the first aspect, the cap layer is made of the third group-III nitride having a composition of $Al_{y3}Ga_{z3}N$ (y3+z3=1, z3>0) being doped with an acceptor element.

In a fifth aspect of the present invention, in the epitaxial substrate according to the fourth aspect, the acceptor element is Mg.

In a sixth aspect of the present invention, in the epitaxial substrate according to the first aspect, the first group-III nitride is $Al_{y1}Ga_{z1}N$ (y1+z1=1, z1>0).

In a seventh aspect of the present invention, in the epitaxial substrate according to the sixth aspect, the first group-III nitride is GaN.

In an eighth aspect of the present invention, the epitaxial substrate according to the first aspect further includes a spacer layer provided between the channel layer and the barrier layer, the spacer layer being made of a fourth group-III nitride having a composition of $In_{x4}Al_{y4}Ga_{z4}N$ (x4+y4+z4=1, y4>0) and having a larger band gap than that of the second group-III nitride.

In a ninth aspect of the present invention, in the epitaxial substrate according to the eighth aspect, the fourth group-III nitride is AlN.

In a tenth aspect of the present invention, a method for manufacturing an epitaxial substrate for use in a semiconductor element, in which a group of group-III nitride layers are laminated on a base substrate such that a (0001) crystal plane of the group of group-III nitride layers is substantially in parallel with a substrate surface of the base substrate, is provided. The method includes: a channel layer formation step for forming a channel layer on a base substrate, the channel layer being made of a first group-III nitride having a composition of $In_{x1}Al_{y1}Ga_{z1}N$ (x1+y1+z1=1, z1>0); a barrier layer formation step for forming a barrier layer on the channel layer, the barrier layer being made of a second group-III nitride having a composition of $In_{x2}Al_{y2}N$ (x2+y2=1, x2>0, y2>0); an anti-diffusion layer formation step for forming an anti-diffusion layer on the barrier layer, the anti-diffusion layer being made of AlN; and a cap layer formation step for forming a cap layer on the anti-diffusion layer, the cap layer being made of a third group-III nitride having a composition of $In_{x3}Al_{x3}Ga_{z3}N$ (x3+y3+z3=1, z3>0).

In an eleventh aspect of the present invention, in the method for manufacturing the epitaxial substrate according to the tenth aspect, a band gap of the second group-III nitride is larger than a band gap of the first group-III nitride.

In a twelfth aspect of the present invention, in the method for manufacturing the epitaxial substrate according to the tenth aspect, the second group-III nitride is $In_{x2}Al_{y2}N$ (x2+y2=1, 0.14≤x2≤0.24); and the third group-III nitride is $Al_{y3}Ga_{z3}N$ (y3+z3=1, z3>0).

In a thirteenth aspect of the present invention, in the method for manufacturing the epitaxial substrate according to the tenth aspect, in the cap layer formation step, the cap layer is formed by doping an acceptor element to the third group-III nitride having a composition of $Al_{y3}Ga_{z3}N$ (y3+z3=1, z3>0).

In a fourteenth aspect of the present invention, in the method for manufacturing the epitaxial substrate according to the thirteenth aspect, the acceptor element is Mg.

In a fifteenth aspect of the present invention, in the method for manufacturing the epitaxial substrate according to the tenth aspect, the first group-III nitride is $Al_{y1}Ga_{z1}N$ (y1+z1=1, z1>0).

In an sixteenth aspect of the present invention, in the method for manufacturing the epitaxial substrate according to the fifteenth aspect, the first group-III nitride is GaN.

In a seventeenth aspect of the present invention, the method for manufacturing the epitaxial substrate according to the tenth aspect further includes a spacer layer formation step for forming a spacer layer on the channel layer, the spacer layer being made of a fourth group-III nitride having a composition of $In_{x4}Al_{y4}Ga_{z4}N$ (x4+y4+z4=1, y4>0) and having a larger band gap than that of the second group-III nitride, wherein the barrier layer is formed on the spacer layer in the barrier layer formation step.

In a eighteenth aspect of the present invention, in the method for manufacturing the epitaxial substrate according to the seventeenth aspect, the fourth group-III nitride is AlN.

In the first to eighteenth aspects of the present invention, the cap layer is provided on the barrier layer, and additionally the AlN layer serving as the anti-diffusion layer is provided between the layers. Thereby, in the epitaxial substrate, diffusion of elements from the cap layer to the barrier layer is prevented. As a result, an epitaxial substrate including a cap layer and having excellent characteristics is achieved. Furthermore, a semiconductor element or a PN junction diode element including the epitaxial substrate is achieved.

Particularly, in the third and twelfth aspects of the present invention, even when the cap layer is provided, a sheet resistance, a concentration of a two-dimensional electron gas, and a mobility of the two-dimensional electron gas, that are equivalent to those of an epitaxial substrate not including the cap layer, are achieved.

Particularly, in the fourth, fifth, ninth, thirteenth, and fourteenth aspect of the present invention, an epitaxial substrate in which a reverse leakage current in a PN junction portion is suitably reduced is achieved. Furthermore, a semiconductor element or a PN junction diode element including the epitaxial substrate is achieved.

BRIEF DESCRIPTION OF THE DRAWINGS

FIG. 2 is a depth profile of main elements in an epitaxial substrate 10 including an anti-diffusion layer 6.

FIG. 3 is a depth profile of main elements in an epitaxial substrate 10 including no anti-diffusion layer 6.

DETAILED DESCRIPTION OF THE INVENTION

<Configuration of Epitaxial Substrate>

Figure 1:
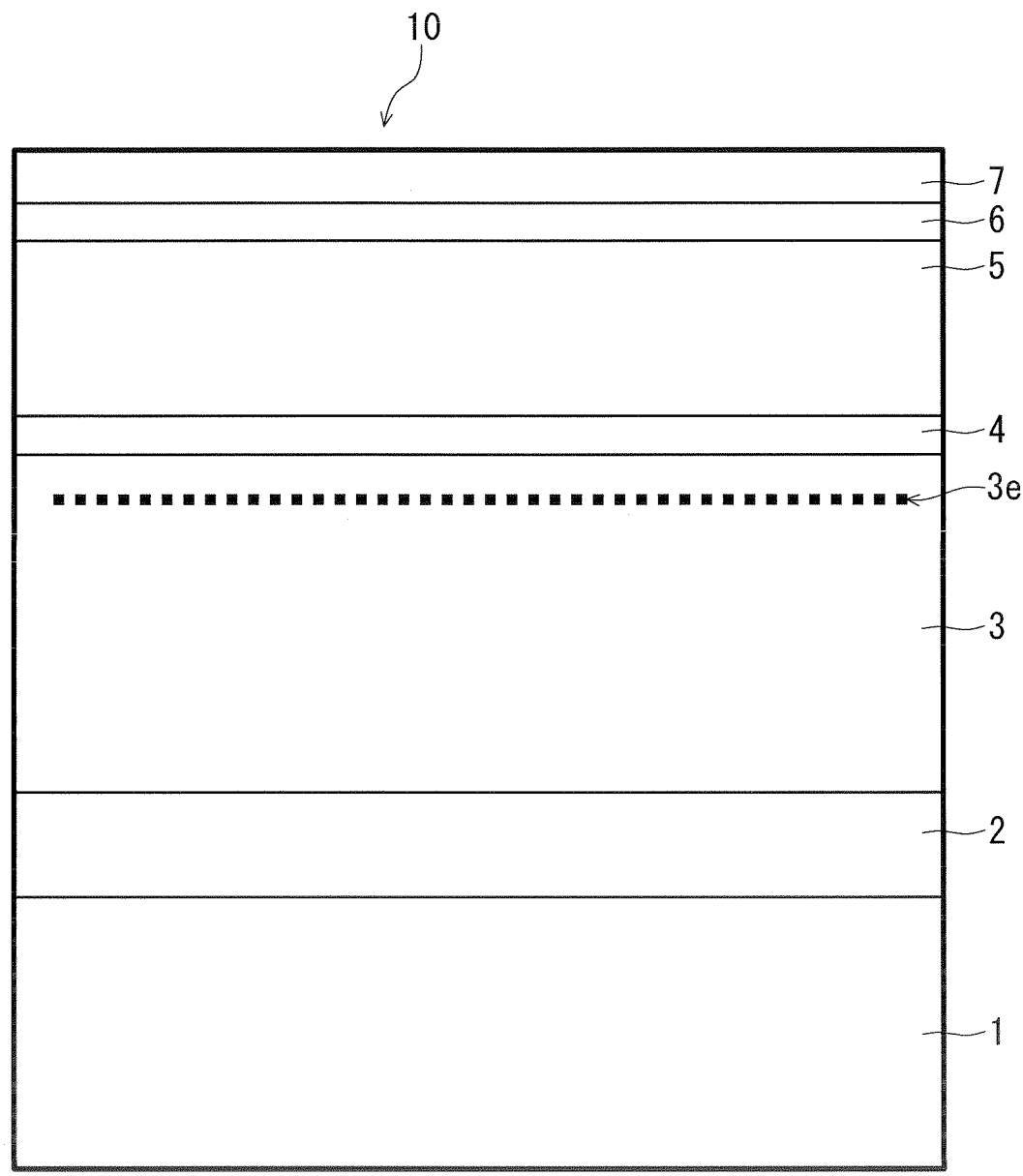
FIG. 1 is a schematic cross-sectional view showing an outline configuration of an epitaxial substrate 10 according to an embodiment of the present invention.

FIG. 1 is a schematic cross-sectional view showing an outline configuration of an epitaxial substrate 10 according to an embodiment of the present invention. The epitaxial substrate 10 has a configuration in which a base substrate 1, a buffer layer 2, a channel layer 3, a spacer layer 4, a barrier layer 5, an anti-diffusion layer 6, and a cap layer 7 are laminated. The thickness ratio among the layers shown in FIG. 1 does not reflect the actual ratio. In one preferable example, all of the buffer layer 2, the channel layer 3, the spacer layer 4, the barrier layer 5, the anti-diffusion layer 6, and the cap layer 7 are epitaxially formed through a MOCVD process (Metal Organic Chemical Vapor Deposition) (details will be described later).

The following description is directed to a case where the MOCVD process is used for the formation of each layer. However, a method appropriated selected from other epitaxial growth processes including vapor deposition processes and liquid phase deposition processes such as MBE, HVPE, and LPE may be adopted, or different growth processes may be adopted in combination, as long as the method can form each of the layers with good crystallinity.

No particular limitation is put on the base substrate 1, as long as the base substrate 1 allows a nitride semiconductor layer with good crystallinity to be formed thereon. In one preferable example, a single crystal 6H—SiC substrate is used. However, a substrate made of sapphire, Si, GaAs, spinel, MgO, ZnO, ferrite, or the like, may be adopted.

The buffer layer 2 is a layer made of AlN with a thickness of about several hundreds nm, for the purpose of obtaining good crystal quality of the channel layer 3, the spacer layer 4, the barrier layer 5, the anti-diffusion layer 6, and the cap layer 7 which will be formed on the buffer layer 2. In one preferable example, the buffer layer 2 is formed with a thickness of 200 nm.

The channel layer 3 is a layer made of a group-III nitride (first group-III nitride) having a composition of $In_{x1}Al_{y1}Ga_{z1}N$ ($x1+y1+z1=1$), and formed with a thickness of about several μm. Preferably, the channel layer 3 is made of a group-III nitride having a composition of $Al_{y1}Ga_{z1}N$ ($y1+z1=1$, $z1>0$), and more preferably, the channel layer 3 is made of GaN.

The barrier layer 5 is a layer made of a group-III nitride (second group-III nitride) having a composition of $In_{x2}Al_{y2}N$ ($x2+y2=1$, $x2>$, $y2>0$), and formed with a thickness of about several nm to several tens nm. Preferably, $0.14 \leq x2 \leq 0.24$ is satisfied. When the value of x2 is out of this range, strain acting on the barrier layer 5 exceeds ±0.5%. This is not preferable, because, in a case of forming a Schottky junction on the epitaxial substrate 10, an influence of crystal strain on the reliability of the Schottky junction is large.

The channel layer 3 and the barrier layer 5 are formed so as to satisfy such a composition range that the band gap of a second group-III nitride constituting the latter is larger than the band gap of a first group-III nitride constituting the former.

The anti-diffusion layer 6 is made of AlN with a thickness of about one nm to more than ten nm. Preferably, the anti-diffusion layer 6 is a layer formed with a thickness of about 3 nm to 10 nm. The anti-diffusion layer 6 is provided for the purpose of preventing elements such as Ga and Mg existing in the cap layer 7 from diffusing into the barrier layer 5. Details of the functions and effects of the anti-diffusion layer 6 will be described later.

The cap layer 7 is made of a group-III nitride having a composition of $In_{x3}Al_{y3}Ga_{z3}N$ ($x3+y3+z3=1$, $z3>0$) with a thickness of about several nm to several tens nm. Preferably, the cap layer 7 is formed with a thickness of about 10 nm to 50 nm.

A specific composition of the cap layer 7 is appropriately set in accordance with an object of forming the epitaxial substrate 10. For example, to obtain a current collapse suppression effect in a case of forming an HEMT device by using the epitaxial substrate 10, it is preferable that the cap layer 7 is made of GaN ($x3=y3=0$) or $Al_{y3}Ga_{z3}N$ ($x3=0$). More specifically, it is preferable that the cap layer 7 is formed so as to satisfy $0 \leq y3 \leq 0.2$.

Alternatively, to form a PN junction instead of a Schottky junction by providing a gate electrode in a case of forming a semiconductor element by using the epitaxial substrate 10, it is preferable that the cap layer 7 is formed by doping Mg as an acceptor element into GaN.

Moreover, the spacer layer 4 is provided between the channel layer 3 and the barrier layer 5. The spacer layer 4 has a composition of $In_{x4}Al_{y4}Ga_{z4}N$ ($x4+y4+z4=1$), and made of a group-III nitride (fourth group-III nitride) that contains at least Al (that satisfies $y4>0$) with a thickness of 0.5 nm to 1.5 nm.

In the epitaxial substrate 10 having such a layer configuration, a two-dimensional electron gas region 3e in which a two-dimensional electron gas exists with a high concentration is formed at an interface between the channel layer 3 and the spacer layer 4 (in more detail, in a portion of the channel layer 3 near the interface).

Preferably, the spacer layer 4 and the barrier layer 5 are formed so as to satisfy such a composition range that the band gap of a fourth group-III nitride constituting the former is equal to or larger than the band gap of the second group-III nitride constituting the latter. In such a case, an alloy scattering effect is suppressed, and the concentration and the mobility of the two-dimensional electron gas are improved. More preferably, the spacer layer 4 is made of AlN ($x4=0$, $y4=1$, $z4=0$). In this case, the spacer layer 4 is made of an Al—N binary compound. This further suppresses the alloy scattering effect as compared with a ternary compound containing Ga. Thus, the concentration and the mobility of the two-dimensional electron gas are further improved. This discussion about the composition range does not exclude the possibility that the spacer layer 4 contains an impurity.

It is not essential that the spacer layer 4 is provided in the epitaxial substrate 10. It may be also acceptable that the barrier layer 5 is formed directly on the channel layer 3. In this case, the two-dimensional electron gas region 3e is formed at an interface between the channel layer 3 and the barrier layer 5.

To the epitaxial substrate 10 having the above-described configuration, an electrode pattern and other components are appropriately provided. Thereby, various semiconductor elements such as an HEMT device and a diode element are obtained.

<Method for Preparing HEMT Device>

Next, a method for preparing the epitaxial substrate 10 having the above-described configuration will be described.

The preparation of the epitaxial substrate 10 can be performed by using a known MOCVD apparatus. More specifically, an MOCVD apparatus is used that is configured to feed into a reactor, a source gas (TMI, TMA, TMG) of an organic metal (MO) of In, Al, Ga, a source gas (for example, $Cp_2Mg$) of an dopant element such as Mg, an ammonia gas, a hydrogen gas, and a nitrogen gas.

Firstly, for example, a (0001)-oriented 6H—SiC substrate having a diameter of two inches is prepared as the base substrate 1, and this base substrate 1 is placed on a susceptor provided in a reactor of the MOCVD apparatus. The inside of the reactor is vacuumed, and then, an atmosphere in hydrogen/nitrogen mixed flow state is made while a pressure inside the reactor is kept at a predetermined value in a range of 5 kPa to 50 kPa. In this condition, the susceptor is heated to thereby raise the temperature of the substrate.

When the temperature of the susceptor reaches a predetermined temperature in a range of 950° C. to 1250° C. (for example, 1050° C.), which is a buffer layer formation temperature, an Al source gas and a $NH_3$ gas are introduced into the reactor, and thereby an AlN layer serving as the buffer layer 2 is formed.

After the MN layer is formed, the temperature of the susceptor is kept at a predetermined channel layer formation temperature, and a metal organic source gas and ammonia gas are introduced into the reactor in accordance with the composition of the channel layer 3, and thereby an $In_{x1}Al_{y1}Ga_{z1}N$ layer (x1=0, 0≤y1≤0.3) serving as the channel layer 3 is formed. Here, the channel layer formation temperature T1 is a value determined from a temperature range of 950° C. or more and 1250° C. or less in accordance with a value of an AlN mole fraction y1 in the channel layer 3. No particular limitation is put on the pressure in the reactor at a time when the channel layer 3 is formed. A pressure can be appropriately selected from a range of 10 kPa to an atmospheric pressure (100 kPa).

After the $In_{x1}Al_{y1}Ga_{z1}N$ layer is formed, a nitrogen gas atmosphere is maintained inside the reactor while the temperature of the susceptor is kept. The reactor pressure is set to be 10 kPa, and then a metal organic source gas and an ammonia gas are introduced into the reactor, so that an $In_{x4}Al_{y4}Ga_{z4}N$ layer serving as the spacer layer 4 is formed with a predetermined thickness.

After the $In_{x4}Al_{y4}Ga_{z4}N$ layer is formed, an $In_{x2}Al_{y2}N$ serving as the barrier layer 5 is formed. For this purpose, the temperature of the susceptor is kept at a predetermined barrier layer formation temperature that is 650° C. or higher and 800° C. or lower, and the pressure in the reactor is kept at a predetermined value in a range of 1 kPa to 30 kPa. Then, an ammonia gas and a metal organic source gas with a flow ratio in accordance with the composition of the barrier layer 5 are introduced into the reactor such that a V/III ratio having a predetermined value of 3000 or more and 20000 or less is obtained.

After the $In_{x2}Al_{y2}N$ layer is formed, then the temperature of the susceptor is set to be a predetermined anti-diffusion layer formation temperature. In this condition, the flow ratio of the metal organic source gas is adjusted, and an AlN layer serving as the anti-diffusion layer 6 is formed with a predetermined thickness.

After the AlN layer is formed, then the temperature of the susceptor is set to be a predetermined cap layer formation temperature. In this condition, the flow ratio of the metal organic source gas is adjusted in accordance with the composition of the cap layer 7, so that an $In_{x3}Al_{y3}Ga_{z3}N$ layer serving as the cap layer 7 is formed with a predetermined thickness. In a case of doping an acceptor element such as Mg, a source gas of this element is also fed with an appropriate flow ratio. Upon the formation of the cap layer 7, the preparation of the epitaxial substrate 10 is completed.

<Functions and Effects of Anti-Diffusion Layer>

Next, functions and effects of providing the anti-diffusion layer 6 in the epitaxial substrate 10 will be described.

As described above, the anti-diffusion layer 6 is provided for the purpose of preventing elements such as Ga and Mg existing in the cap layer 7 from diffusing into the barrier layer 5. The diffusion of these elements progresses during heating of the epitaxial substrate 10 for the formation of the cap layer 7. FIGS. 2 to 5 are diagrams showing the relationship between a distribution of elements and the presence or absence of the anti-diffusion layer 6.

Firstly, FIGS. 2 and 3 show depth profiles of Ga element, Al element, and In element measured by means of auger electron spectroscopy with respect to two types of epitaxial substrates 10 that were prepared under the same conditions except for the presence or absence of the anti-diffusion layer 6. FIG. 2 shows a depth profile for the epitaxial substrate 10 including the anti-diffusion layer 6. FIG. 3 shows a depth profile for the epitaxial substrate 10 not including the anti-diffusion layer 6.

In both of the epitaxial substrates 10, the barrier layer 5 is made of $In_{0.18}Al_{0.82}N$ and the cap layer 7 is made of GaN. In both of FIGS. 2 and 3, the position indicated by the Sputter time being 0 min. corresponds to a surface of the epitaxial substrate 10 (a surface of the cap layer 7), and a greater value of the Sputter time indicates a position farther from the surface.

In FIG. 2, when the Sputter time is 5 min., the Ga concentration steeply drops and reaches zero while the Al concentration steeply rises to form a peak. It is considered that this peak corresponds to the AlN layer serving as the anti-diffusion layer 6. In a range where the Sputter time is longer than 6 min., the Al concentration and the In concentration are substantially constant. In a case where the anti-diffusion layer 6 is provided, there is no region in which Ga and In exist together.

In FIG. 3, on the other hand, around when the Sputter time exceeds 3 min., the Ga concentration gently drops and, around 15 min., reaches zero. Around 5 min., the Al concentration and the In concentration rise. In the profile of the Al concentration, no peak is observed.

These results indicate that, in a case of not providing the anti-diffusion layer 6 (FIG. 3), the Ga element diffuses from the cap layer 7 into the barrier layer 5, while in a case of providing the anti-diffusion layer 6 (FIG. 2), the diffusion of the Ga element from the cap layer 7 to the barrier layer 5 is suitably prevented by the anti-diffusion layer 6.

Figure 4:
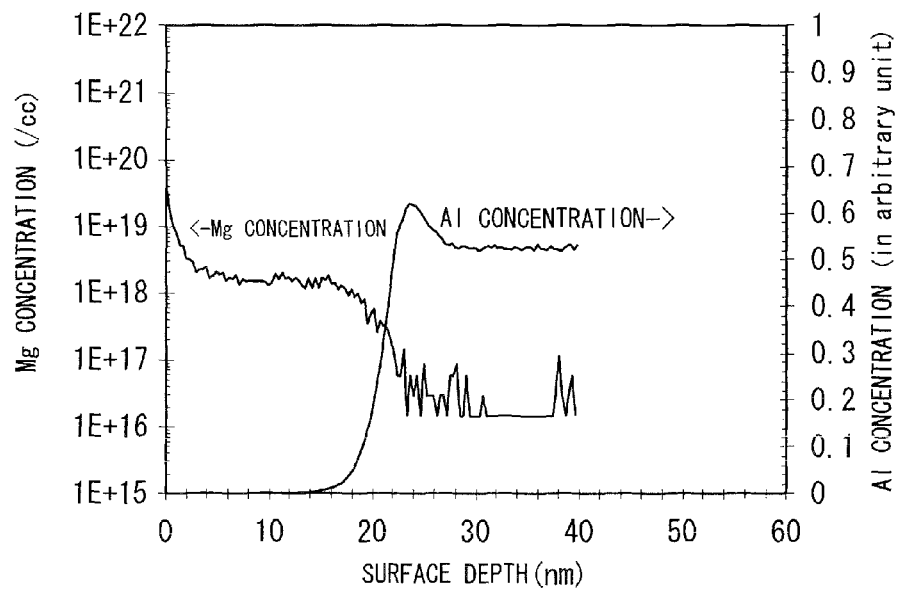
FIG. 4 is a concentration profile of main elements in an epitaxial substrate 10 including an anti-diffusion layer 6.
Figure 5:
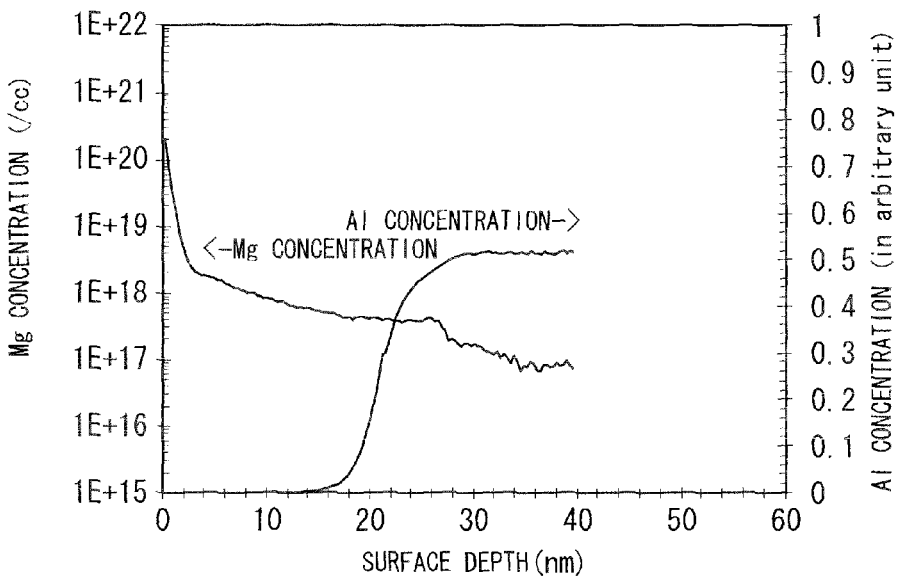
FIG. 5 is a concentration profile of main elements in an epitaxial substrate 10 including no anti-diffusion layer 6.

FIGS. 4 and 5 show concentration profiles of Mg element and Al element measured by means of SIMS (secondary ion mass spectrometry) with respect to two types of epitaxial substrates 10 that were prepared under the same conditions except for the presence or absence of the anti-diffusion layer 6. FIG. 4 shows a concentration profile for the epitaxial substrate 10 including the anti-diffusion layer 6. FIG. 5 shows a concentration profile for the epitaxial substrate 10 not including the anti-diffusion layer 6. In both of the epitaxial substrates 10, the barrier layer 5 is made of $In_{0.18}Al_{0.82}N$ and the cap layer 7 is made of GaN doped with Mg.

In FIG. 4, around when the surface depth is 15 nm to 20 nm, the Mg concentration steeply drops, while around when the surface depth is 20 nm to 25 nm, the Al concentration steeply rises and forms a peak around when the surface depth is 24 nm. It is considered that this peak corresponds to the AlN layer serving as the anti-diffusion layer 6. In a range where the surface depth is greater than 28 nm, the Al concentration is substantially constant.

In FIG. 5, on the other hand, in a range where the surface depth is about 2 nm to about 25 nm, the Mg concentration gently drops. In a range where the surface depth is about 20 nm to about 30 nm, the Al concentration rises. In the profile of the Al concentration, no peak is observed.

These results indicate that, in a case of not providing the anti-diffusion layer 6 (FIG. 5), the Mg element diffuses from the cap layer 7 into the barrier layer 5, while in a case of providing the anti-diffusion layer 6 (FIG. 4), the diffusion of the Mg element from the cap layer 7 to the barrier layer 5 is suitably prevented by the anti-diffusion layer 6.

That is, the results shown in FIGS. 2 to 5 clearly show that forming an AlN layer as the anti-diffusion layer 6 is effective in suppressing the diffusion of elements from the cap layer 7.

As in this embodiment, in the epitaxial substrate 10 including the cap layer 7 and the anti-diffusion layer 6, excellent characteristics are achieved, as compared with an epitaxial substrate including only the cap layer 7 and not including the anti-diffusion layer 6.

For example, even when the cap layer 7 is provided, a sheet resistance, a concentration of the two-dimensional electron gas, and a mobility of the two-dimensional electron gas, that are equivalent to those of an epitaxial substrate not including the cap layer 7, are achieved.

In a case where the cap layer 7 is made of GaN doped with Mg as an acceptor element to thereby form a PN junction, a reverse leakage current occurring in the PN junction is reduced to 1 nA or less.

As described above, it is preferable that the thickness of the anti-diffusion layer 6 is 3 nm or more. Even when the thickness is less than 3 nm, a diffusion prevention effect is obtained to a certain degree, but from the viewpoint of reliably ensuring good electrical characteristics, it is preferable that the anti-diffusion layer 6 is formed with a thickness of 3 nm or more.

As described above, in this embodiment, the cap layer is provided on the barrier layer, and additionally an AlN layer serving as an anti-diffusion layer is provided between the layers. Thereby, in an epitaxial substrate, diffusion of elements from the cap layer to the barrier layer is prevented. As a result, an epitaxial substrate including a cap layer and having excellent characteristics is achieved. Furthermore, a semiconductor element or a PN junction diode element including the epitaxial substrate is achieved.

EXAMPLES

Example 1

In this example, fifty-four types of epitaxial substrates 10 in total were prepared, which were different in the combination of conditions under which the barrier layer 5, the anti-diffusion layer 6, and the cap layer 7 were formed. To be specific, as for the composition of the barrier layer 5, three different levels were provided. As for the film thickness of the anti-diffusion layer 6, five different levels were provided, including a case where the anti-diffusion layer 6 was not provided (film thickness was 0 nm). As for the composition of the cap layer 7, four different levels were provided, including a case where the cap layer 7 is not provided. As for the film thickness of the cap layer 7, two different levels were provided, including a case where the cap layer 7 is not provided. Each of the obtained epitaxial substrates 10 was evaluated for electrical characteristics by using the Hall effect method.

Until the formation of the spacer layer 4, the same procedures were performed for all the epitaxial substrates 10.

To be specific, firstly, a plurality of (0001)-oriented 6H—SiC substrates having a diameter of two inches were prepared as the base substrate 1. The thickness thereof was 300 μm. Each of the substrates was placed in a reactor of an MOCVD apparatus, and the inside of the reactor was vacuumed. Then, the pressure in the reactor was set to be 30 kPa, and an atmosphere in a hydrogen/nitrogen mixed flow state was made. Then, the susceptor was heated, to thereby raise the temperature of the base substrate 1.

After the temperature of the susceptor reached 1050° C., a TMA bubbling gas and an ammonia gas were introduced into the reactor, and an AlN layer having a thickness of 200 nm was formed as the buffer layer.

Then, the temperature of the susceptor was set to be a predetermined temperature, a TMG bubbling gas serving as the metal organic source gas and an ammonia gas were introduced into the reactor with a predetermined flow ratio. Thus, a GaN layer serving as the channel layer 3 was formed with a thickness of 2 μm.

After the formation of the channel layer 3, the pressure in the reactor was set to be 10 kPa, and then a TMA bubbling gas and an ammonia gas were introduced into the reactor. Thus, an AlN layer having a thickness of 1 nm was formed as the spacer layer 4.

After the formation of the spacer layer 4, the barrier layer 5 was then formed. As the composition of the barrier layer 5, three different levels, namely, $In_{0.14}Al_{0.86}N$, $In_{0.18}Al_{0.82}N$, and $In_{0.22}Al_{0.78}N$, were adopted. In these samples, the temperature of the susceptor was 770° C., 745° C., and 720° C., respectively. In all the samples, the thickness of the barrier layer 5 was 20 nm.

For the sample in which the anti-diffusion layer 6 was to be provided, after the formation of the barrier layer 5, an AlN layer serving as the anti-diffusion layer 6 was formed with a thickness of 1.5, 3, 6, or 10 nm. The temperature of the susceptor was 800° C.

For the sample in which the cap layer 7 was to be provided, after the formation of the barrier layer 5 or the anti-diffusion layer 6, the cap layer 7 was formed with a thickness of 10 nm or 50 nm. As the composition of the cap layer 7, three different levels, namely, GaN, $Al_{0.15}Ga_{0.85}N$, and $Al_{0.20}Ga_{0.80}N$, were adopted. The temperature of the susceptor was 800° C.

For each of the samples, after the formation of predetermined layers, the temperature of the susceptor was dropped to about the room temperature. After the inside of the reactor was returned to the atmospheric pressure, the prepared epitaxial substrate 10 was taken out. Through the above-described procedures, each of the epitaxial substrates 10 was obtained.

To evaluate the electrical characteristics by means of the Hall effect method, a multilayer metal film made of Ti/Al/Ni/Au (with film thicknesses of 25, 75, 15, and 100 nm, respectively) was vapor-deposited on the surface of each epitaxial substrate 10 (the surface of the cap layer 7), to form an ohmic electrode. Then, to give good contact characteristics to this electrode, a heat treatment was performed for 30 seconds in a nitrogen gas atmosphere at 800° C.

The epitaxial substrate 10 in which the electrode was formed in this manner was measured for a two-dimensional electron gas concentration (2 DEG concentration), a two-dimensional electron gas mobility (2 DEG mobility), and a sheet resistance by means of the Hall effect method. Preparation conditions unique to each of the epitaxial substrates 10, and results of evaluation of electrical characteristics are listed in Tables 1 to 3.

TABLE 1

| Sample No. | Barrier Layer | Composition of Cap Layer | Thickness of Cap Layer (nm) | Thickness of Anti-Diffusion Layer (nm) | 2DEG Concentration ($cm^{-2}$) | 2DEG Mobility ($cm^{-2}/Vs$) | Sheet Resistance ($\Omega/sq$) |
|---|---|---|---|---|---|---|---|
| 1-1 | $In_{0.14}Al_{0.86}N$ | Not Provided | — | — | 3.1E+13 | 1,100 | 183 |
| 1-2 | | GaN | 10 | — | 1.4E+13 | 600 | 733 |
| 1-3 | | | | 1.5 | 2.5E+13 | 950 | 263 |
| 1-4 | | | | 3 | 3.1E+13 | 1,080 | 186 |

TABLE 1-continued

| Sample No. | Barrier Layer | Composition of Cap Layer | Thickness of Cap Layer (nm) | Thickness of Anti-Diffusion Layer (nm) | 2DEG Concentration (cm$^{-2}$) | 2DEG Mobility (cm$^{-2}$/Vs) | Sheet Resistance (Ω/sq) |
|---|---|---|---|---|---|---|---|
| 1-5 | | | | 6 | 3.1E+13 | 1,100 | 183 |
| 1-6 | | | | 10 | 3.1E+13 | 1,100 | 183 |
| 1-7 | | Not Provided | — | 0 | 3.1E+13 | 1,100 | 183 |
| 1-8 | | Al$_{0.15}$Ga$_{0.85}$N | 10 | 0 | 1.5E+13 | 660 | 630 |
| 1-9 | | | | 1.5 | 2.4E+13 | 950 | 274 |
| 1-10 | | | | 3 | 3.1E+13 | 1,100 | 181 |
| 1-11 | | | | 6 | 3.1E+13 | 1,100 | 183 |
| 1-12 | | | | 10 | 3.1E+13 | 1,100 | 183 |
| 1-13 | | Not Provided | — | 0 | 3.1E+13 | 1,090 | 185 |
| 1-14 | | Al$_{0.20}$Ga$_{0.80}$N | 10 | 0 | 1.4E+13 | 680 | 656 |
| 1-15 | | | | 1.5 | 2.3E+13 | 960 | 283 |
| 1-16 | | | | 3 | 3.1E+13 | 1,100 | 183 |
| 1-17 | | | | 6 | 3.1E+13 | 1,090 | 185 |
| 1-18 | | | | 10 | 3.1E+13 | 1,100 | 183 |

TABLE 2

| Sample No. | Barrier Layer | Composition of Cap Layer | Thickness of Cap Layer (nm) | Thickness of Anti-Diffusion Layer (nm) | 2DEG Concentration (cm$^{-2}$) | 2DEG Mobility (cm$^{-2}$/Vs) | Sheet Resistance (Ω/sq) |
|---|---|---|---|---|---|---|---|
| 1-19 | In$_{0.18}$Al$_{0.82}$N | Not Provided | — | 0 | 2.6E+13 | 1,100 | 218 |
| 1-20 | | GaN | 10 | 0 | 1.2E+13 | 600 | 867 |
| 1-21 | | | | 1.5 | 2.3E+13 | 950 | 286 |
| 1-22 | | | | 3 | 2.6E+13 | 1,080 | 222 |
| 1-23 | | | | 6 | 2.6E+13 | 1,100 | 218 |
| 1-24 | | | | 10 | 2.6E+13 | 1,100 | 218 |
| 1-25 | | Not Provided | — | 0 | 2.6E+13 | 1,100 | 218 |
| 1-26 | | Al$_{0.15}$Ga$_{0.85}$N | 50 | 0 | 1.1E+13 | 660 | 860 |
| 1-27 | | | | 1.5 | 2.2E+13 | 950 | 299 |
| 1-28 | | | | 3 | 2.6E+13 | 1,100 | 216 |
| 1-29 | | | | 6 | 2.6E+13 | 1,100 | 218 |
| 1-30 | | | | 10 | 2.6E+13 | 1,100 | 218 |
| 1-31 | | Not Provided | — | 0 | 2.6E+13 | 1,090 | 220 |
| 1-32 | | Al$_{0.20}$Ga$_{0.80}$N | 10 | 0 | 1.0E+13 | 680 | 918 |
| 1-33 | | | | 1.5 | 2.3E+13 | 960 | 283 |
| 1-34 | | | | 3 | 2.6E+13 | 1,100 | 218 |
| 1-35 | | | | 6 | 2.6E+13 | 1,090 | 220 |
| 1-36 | | | | 10 | 2.6E+13 | 1,100 | 218 |

TABLE 3

| Sample No. | Barrier Layer | Composition of Cap Layer | Thickness of Cap Layer (nm) | Thickness of Anti-Diffusion Layer (nm) | 2DEG Concentration (cm$^{-2}$) | 2DEG Mobility (cm$^{-2}$/Vs) | Sheet Resistance (Ω/sq) |
|---|---|---|---|---|---|---|---|
| 1-37 | In$_{0.22}$Al$_{0.78}$N | Not Provided | — | 0 | 2.0E+13 | 1,140 | 274 |
| 1-38 | | GaN | 10 | 0 | 6.0E+12 | 600 | 1,734 |
| 1-39 | | | | 1.5 | 1.6E+13 | 950 | 411 |
| 1-40 | | | | 3 | 2.0E+13 | 1,130 | 276 |
| 1-41 | | | | 6 | 2.0E+13 | 1,150 | 271 |
| 1-42 | | | | 10 | 2.0E+13 | 1,150 | 271 |
| 1-43 | | Not Provided | — | 0 | 2.0E+13 | 1,150 | 271 |
| 1-44 | | Al$_{0.15}$Ga$_{0.85}$N | 10 | 0 | 7.0E+12 | 660 | 1,351 |
| 1-45 | | | | 1.5 | 1.5E+13 | 950 | 438 |
| 1-46 | | | | 3 | 2.0E+13 | 1,160 | 269 |
| 1-47 | | | | 6 | 2.0E+13 | 1,140 | 274 |
| 1-48 | | | | 10 | 2.0E+13 | 1,150 | 271 |
| 1-49 | | Not Provided | — | 0 | 2.0E+13 | 1,090 | 286 |
| 1-50 | | Al$_{0.20}$Ga$_{0.80}$N | 10 | 0 | 6.5E+12 | 680 | 1,412 |
| 1-51 | | | | 1.5 | 1.6E+13 | 960 | 406 |
| 1-52 | | | | 3 | 2.0E+13 | 1,150 | 271 |
| 1-53 | | | | 6 | 2.0E+13 | 1,160 | 269 |
| 1-54 | | | | 10 | 2.0E+13 | 1,140 | 274 |

Tables 1 to 3 reveal that, irrespective of the composition of the barrier layer 5, electrical characteristics obtained in the epitaxial substrates 10 (sample Nos. 1-4 to 1-6, 1-10 to 1-12, 1-16 to 1-18, 1-22 to 1-24, 1-28 to 1-30, 1-34 to 1-36, 1-40 to 1-42, 1-46 to 1-48, and 1-52 to 1-54) in which the cap layer 7 was formed after the formation of the anti-diffusion layer 6 with a thickness of 3 nm or more were equivalent to electrical characteristics of the epitaxial substrates 10 (sample Nos. 1-2, 1-8, 1-14, 1-20, 1-26, 1-32, 1-38, 1-44, and 1-50) in which the anti-diffusion layer 6 and the cap layer 7 were not provided.

These results indicate that, by forming the anti-diffusion layer 6 with a thickness of 3 nm or more, electrical characteristics equivalent to the electrical characteristics of an epitaxial substrate having no cap layer can be given to the epitaxial substrate 10 even though the epitaxial substrate 10 actually includes a cap layer.

As for the epitaxial substrate 10 (sample Nos. 1-23) including the anti-diffusion layer 6 and the epitaxial substrate 10 (sample Nos. 1-20) not including the anti-diffusion layer 6, a depth profile of the Ga element, the Al element, and the In element was obtained by means of the auger electron spectroscopy. FIG. 2 shows a result for the former, and FIG. 3 shows a result for the latter. As described above, from FIG. 3, the diffusion of the Ga element from the cap layer 7 to the barrier layer 5 is observed, while from FIG. 2, it is observed that the diffusion of the Ga element from the cap layer 7 to the barrier layer 5 is suitably prevented by the anti-diffusion layer 6. These results indicate that forming an AlN layer as the anti-diffusion layer 6 is effective in suppressing the diffusion of Ga element from the cap layer 7.

Also in the epitaxial substrates 10 (sample Nos. 1-3, 1-9, 1-15, 1-21, 1-27, 1-33, 1-39, 1-45, and 1-51) in which the cap layer 7 was formed after the formation of the anti-diffusion layer 6 with a thickness of 1.5 nm, the electrical characteristics were improved as compared with the epitaxial substrate 10 not including the anti-diffusion layer 6. That is, the diffusion prevention effect of the anti-diffusion layer 6 is, though limited, obtained.

Example 2

In this example, forty-five types of epitaxial substrates 10 in total were prepared, which were different in the combination of conditions under which the barrier layer 5, the anti-diffusion layer 6, and the cap layer 7 were formed. To be specific, as for the composition of the barrier layer 5, three different levels were provided. As for the film thickness of the anti-diffusion layer 6, five different levels were provided, including a case where the anti-diffusion layer 6 was not provided (film thickness was 0 nm). As for a target concentration of the Mg element doped as an acceptor element in the cap layer 7, three different levels were provided. Each of the epitaxial substrates 10 was used to prepare a concentric PN diode element, and its leakage current (reverse leakage current) at a time when reverse bias was applied was measured.

Until the formation of the anti-diffusion layer 6, the same procedures as of example 1 were performed.

The cap layer 7 was formed in a manner that Mg serving as an acceptor element was doped into the GaN layer, after the formation of the barrier layer 5 or the anti-diffusion layer 6. As for the target concentration of the Mg element, three different levels, namely, $1.0 \times 10^{18}/cm^3$, $1.0 \times 10^{19}/cm^3$, and $5.0 \times 10^{19}/cm^3$, were adopted. For all the samples, the thickness was 50 nm. The temperature of the susceptor was 950° C.

In each of the samples, the cap layer 7 was formed, and then the temperature of the susceptor was dropped to about the room temperature. After the inside of the reactor was returned to the atmospheric pressure, the prepared epitaxial substrate 10 was taken out. Then, the sample in which the cap layer 7 was formed was subjected to a heat treatment for 30 minutes in a nitrogen gas atmosphere at 600° C., for activating the Mg acceptor. Through the above-described procedures, the respective epitaxial substrates 10 were obtained.

Then, by using the epitaxial substrate 10 thus obtained, a concentric PN diode element was prepared including a central circular electrode as a P-type electrode and an outer ring electrode as an n-type electrode.

More specifically, firstly, through a known RIE (reactive ion etching) process, a recess etching was performed on an outer peripheral portion of the surface of the epitaxial substrate 10 in order to remove the cap layer 7 and the anti-diffusion layer 6 in a concentric manner. Thus, the barrier layer 5 was exposed.

Then, a multilayer metal electrode made of Ti/Al/Ni/Au (with film thicknesses of 25, 75, 15, and 100 nm, respectively) was vapor-deposited on the surface of the exposed portion of the barrier layer 5, to form an ohmic n-type electrode. Then, to give good contact characteristics to this n-type electrode, a heat treatment was performed for 30 seconds in a nitrogen gas atmosphere at 800° C.

Then, a multilayer metal electrode made of Ni/Au (with film thicknesses of 20 nm and 200 nm) was vapor-deposited on a remaining surface portion (central portion of the concentric circle) of the epitaxial substrate 10 that was not removed in the RIE process. Thus, an ohmic p-type electrode was formed. The p-type electrode was formed with a circular shape having a diameter of 1 mm in a plan view. Furthermore, to give good contact characteristics to this p-type electrode, a heat treatment was performed for 30 seconds in a nitrogen gas atmosphere at 500° C. Thereby, a concentric PN diode element was obtained.

To the diode element obtained in this manner, a reverse bias voltage was applied, and a leakage current was measured. Preparation conditions unique to each of the epitaxial substrates 10 included in the respective diode elements, and results of measurement of the leakage current are listed in Tables 4 to 6.

TABLE 4

| Sample No. | Barrier Layer | Target Concentration of Mg in Cap Layer (cm$^{-3}$) | Thickness of Anti-Diffusion Layer (nm) | Reverse Leakage Current in PN Junction |
|---|---|---|---|---|
| 2-1 | In$_{0.14}$Al$_{0.86}$N | 1.0E+18 | 0 | 15 μA |
| 2-2 | | | 1.5 | 1 μA |
| 2-3 | | | 3 | <1 nA |
| 2-4 | | | 6 | <1 nA |
| 2-5 | | | 10 | <1 nA |
| 2-6 | | 5.0E+19 | 0 | 20 μA |
| 2-7 | | | 1.5 | 2 μA |
| 2-8 | | | 3 | <1 nA |
| 2-9 | | | 6 | <1 nA |
| 2-10 | | | 10 | <1 nA |
| 2-11 | | 1.0E+19 | 0 | 200 μA |
| 2-12 | | | 1.5 | 10 μA |
| 2-13 | | | 3 | <1 nA |
| 2-14 | | | 6 | <1 nA |
| 2-15 | | | 10 | <1 nA |

TABLE 5

| Sample No. | Barrier Layer | Target Concentration of Mg in Cap Layer (cm$^{-3}$) | Thickness of Anti-Diffusion Layer (nm) | Reverse Leakage Current in PN Junction |
|---|---|---|---|---|
| 2-16 | In$_{0.18}$Al$_{0.82}$N | 1.0E+18 | 0 | 20 μA |
| 2-17 | | | 1.5 | 5 μA |
| 2-18 | | | 3 | <1 nA |
| 2-19 | | | 6 | <1 nA |
| 2-20 | | | 10 | <1 nA |
| 2-21 | | 5.0E+19 | 0 | 40 μA |
| 2-22 | | | 1.5 | 1 μA |
| 2-23 | | | 3 | <1 nA |
| 2-24 | | | 6 | <1 nA |
| 2-25 | | | 10 | <1 nA |
| 2-26 | | 1.0E+19 | 0 | 160 μA |
| 2-27 | | | 1.5 | 30 μA |
| 2-28 | | | 3 | <1 nA |
| 2-29 | | | 6 | <1 nA |
| 2-30 | | | 10 | <1 nA |

TABLE 6

| Sample No. | Barrier Layer | Target Concentration of Mg in Cap Layer (cm$^{-3}$) | Thickness of Anti-Diffusion Layer (nm) | Reverse Leakage Current in PN Junction |
|---|---|---|---|---|
| 2-31 | In$_{0.22}$Al$_{0.78}$N | 1.0E+18 | 0 | 15 μA |
| 2-32 | | | 1.5 | 10 μA |
| 2-33 | | | 3 | <1 nA |
| 2-34 | | | 6 | <1 nA |
| 2-35 | | | 10 | <1 nA |
| 2-36 | | 5.0E+19 | 0 | 50 μA |
| 2-37 | | | 1.5 | 10 μA |
| 2-38 | | | 3 | <1 nA |
| 2-39 | | | 6 | <1 nA |
| 2-40 | | | 10 | <1 nA |
| 2-41 | | 1.0E+19 | 0 | 220 μA |
| 2-42 | | | 1.5 | 60 μA |
| 2-43 | | | 3 | <1 nA |
| 2-44 | | | 6 | <1 nA |
| 2-45 | | | 10 | <1 nA |

Tables 4 to 6 reveal that, a reverse leakage current in the order of μA occurred in the epitaxial substrates 10 (sample Nos. 2-1, 2-6, 2-11, 2-16, 2-21, 2-26, 2-31, 2-36, and 2-41) in which the cap layer 7 was formed without forming the anti-diffusion layer 6 and in the epitaxial substrates 10 (sample Nos. 2-2, 2-7, 2-12, 2-17, 2-22, 2-27, 2-32, 2-37, and 2-42) in which the cap layer 7 was formed after the anti-diffusion layer 6 with a thickness of 1.5 nm was formed, while the reverse leakage current was reduced to 1 nA or less in the epitaxial substrates 10 (sample Nos. 2-3 to 2-5, 2-8 to 2-10, 2-13 to 2-15, 2-18 to 2-20, 2-23 to 2-25, 2-28 to 2-30, 2-33 to 2-35, 2-38 to 2-40, and 2-42 to 2-45) in which the cap layer 7 was formed after the anti-diffusion layer 6 with a thickness of 3 nm or more was formed.

These results indicate that forming the anti-diffusion layer 6 with a thickness of 3 nm or more achieves the epitaxial substrate 10 in which a reverse leakage current is suitably suppressed.

For the epitaxial substrate 10 (sample No. 2-19) including the anti-diffusion layer 6 and the epitaxial substrate 10 (sample No. 2-16) not including the anti-diffusion layer 6, a SIMS analysis was performed to thereby obtain a concentration profile of the Mg element and the Al element. FIG. 4 shows a result for the former, and FIG. 5 shows a result for the latter. As described above, from FIG. 5, the diffusion of the Mg element from the cap layer 7 to the barrier layer 5 is observed, while from FIG. 4, it is observed that the diffusion of the Mg element from the cap layer 7 to the barrier layer 5 is suitably prevented by the anti-diffusion layer 6. These results clearly show that forming an MN layer as the anti-diffusion layer 6 is effective in suppressing the diffusion of the Mg element from the cap layer 7.

The invention claimed is:

1. An epitaxial substrate for use in a semiconductor element, in which a group of group-III nitride layers are laminated on a base substrate such that a (0001) crystal plane of said group of group-III nitride layers is substantially in parallel with a substrate surface of said base substrate, said epitaxial substrate comprising:
   a channel layer provided on the substrate;
   a barrier layer provided on the channel layer;
   an anti-diffusion layer provided on the barrier layer; and
   a cap layer provided on the anti-diffusion layer;
   wherein the channel layer is made of a first group-III nitride having a composition of $In_{x1}Al_{y1}Ga_{z1}N$ (x1+y1+z1=1, z1>0);
   the barrier layer is made of a second group-III nitride having a composition of $In_{x2}Al_{y2}N$ (x2+y2=1, x2>, y2>0);
   the anti-diffusion layer is made of AlN and having a thickness of 3 nm or more; and
   the cap layer is made of a third group-III nitride having a composition of $In_{x3}Al_{x3}Ga_{z3}N$ (x3+y3+z3=1, z3>0).

2. The epitaxial substrate according to claim 1, wherein a band gap of said second group-III nitride is larger than a band gap of said first group-III nitride.

3. The epitaxial substrate according to claim 1, wherein said second group-III nitride is $In_{x2}Al_{y2}N$ (x2+y2=1, 0.14≤x2≤0.24),
said third group-III nitride is $Al_{y3}Ga_{z3}N$ (y3+z3=1, z3>0).

4. The epitaxial substrate according to claim 1, wherein said cap layer is made of said third group-III nitride having a composition of $Al_{y3}Ga_{z3}N$ (y3+z3=1, z3>0) being doped with an acceptor element.

5. The epitaxial substrate according to claim 4, wherein said acceptor element is Mg.

6. The epitaxial substrate according to claim 1, wherein said first group-III nitride is $Al_{y1}Ga_{z1}N$ (y1+z1=1, z1>0).

7. The epitaxial substrate according to claim 6, wherein said first group-III nitride is GaN.

8. The epitaxial substrate according to claim 1, further comprising:
   a spacer layer provided between said channel layer and said barrier layer, said spacer layer being made of a fourth group-III nitride having a composition of $In_{x4}Al_{y4}Ga_{z4}N$ (x4+y4+z4=1, y4>0) and having a larger band gap than that of said second group-III nitride.

9. The epitaxial substrate according to claim 8, wherein said fourth group-III nitride is AlN.

10. A method for manufacturing an epitaxial substrate for use in a semiconductor element, in which a group of group-III nitride layers are laminated on a base substrate such that a (0001) crystal plane of said group of group-III nitride layers is substantially in parallel with a substrate surface of said base substrate, said method comprising:
    a channel layer formation step for forming a channel layer on a base substrate, said channel layer being made of a first group-III nitride having a composition of $In_{x1}Al_{y1}Ga_{z1}N$ (x1+y1+z1=1, z1>0);
    a barrier layer formation step for forming a barrier layer on said channel layer, said barrier layer being made of a second group-III nitride having a composition of $In_{x2}Al_{y2}N$ (x2+y2=1, x2>, y2>0);

an anti-diffusion layer formation step for forming an anti-diffusion layer on said barrier layer, said anti-diffusion layer being made of AlN; and a cap layer formation step for forming a cap layer on said anti-diffusion layer, said cap layer being made of a third group-III nitride having a composition of $In_{x3}Al_{x3}Ga_{z3}N$ (x3+y3+z3=1, z3>0).

11. The method for manufacturing the epitaxial substrate according to claim 10, wherein a band gap of said second group-III nitride is larger than a band gap of said first group-III nitride.

12. The method for manufacturing the epitaxial substrate according to claim 10, wherein said second group-III nitride is $In_{x2}Al_{y2}N$ (x2+y2=1, 0.14≤x2≤0.24), said third group-III nitride is $Al_{y3}Ga_{z3}N$ (y3+z3=1, z3>0).

13. The method for manufacturing the epitaxial substrate according to claim 10, wherein in said cap layer formation step, said cap layer is formed by doping an acceptor element to said third group-III nitride having a composition of $Al_{y3}Ga_{z3}N$ (y3+z3=1, z3>0).

14. The method for manufacturing the epitaxial substrate according to claim 13, wherein said acceptor element is Mg.

15. The method for manufacturing the epitaxial substrate according to claim 10, wherein said first group-III nitride is $Al_{y1}Ga_{z1}N$ (y1+z1=1, z1>0).

16. The method for manufacturing the epitaxial substrate according to claim 15, wherein said first group-III nitride is GaN.

17. The method for manufacturing the epitaxial substrate according to claim 10, further comprising:

a spacer layer formation step for forming a spacer layer on said channel layer, said spacer layer being made of a fourth group-III nitride having a composition of $In_{x4}Al_{y4}Ga_{z4}N$ (x4+y4+z4=1, y4>0) and having a larger band gap than that of said second group-III nitride, wherein said barrier layer is formed on said spacer layer in said barrier layer formation step.

18. The method for manufacturing the epitaxial substrate according to claim 17, wherein said fourth group-III nitride is AlN.

* * * * *